United States Patent [19]
Zontelli

[11] 4,167,132
[45] Sep. 11, 1979

[54] CUTTER RING FOR TRIMMING PRINTED CIRCUIT BOARDS

[76] Inventor: Gary R. Zontelli, 14617 Woodhill Ter., Minnetonka, Minn. 55343

[21] Appl. No.: 877,258

[22] Filed: Feb. 13, 1978

[51] Int. Cl.² .............................................. B26D 1/14
[52] U.S. Cl. ...................................... 83/676; 30/347; 30/357
[58] Field of Search .......................... 83/676, 331, 678; 407/60–63; 30/347, 351

[56] References Cited

U.S. PATENT DOCUMENTS

| | | | |
|---|---|---|---|
| 1,670,317 | 5/1928 | Seymour | 83/332 |
| 2,761,196 | 9/1956 | Graves et al. | 407/61 X |
| 3,203,072 | 8/1965 | Careje | 407/61 X |
| 3,772,953 | 11/1973 | Sullivan | 83/332 |

*Primary Examiner*—J. M. Meister
*Attorney, Agent, or Firm*—Peterson, Palmatier, Sturm & Sjoquist, Ltd.

[57] ABSTRACT

The cutter ring finds especial utility in the trimming of printed circuit boards, the cutter ring being provided with a beveled cutting edge having a number of nonuniformly or unevenly spaced notches formed therein.

8 Claims, 14 Drawing Figures

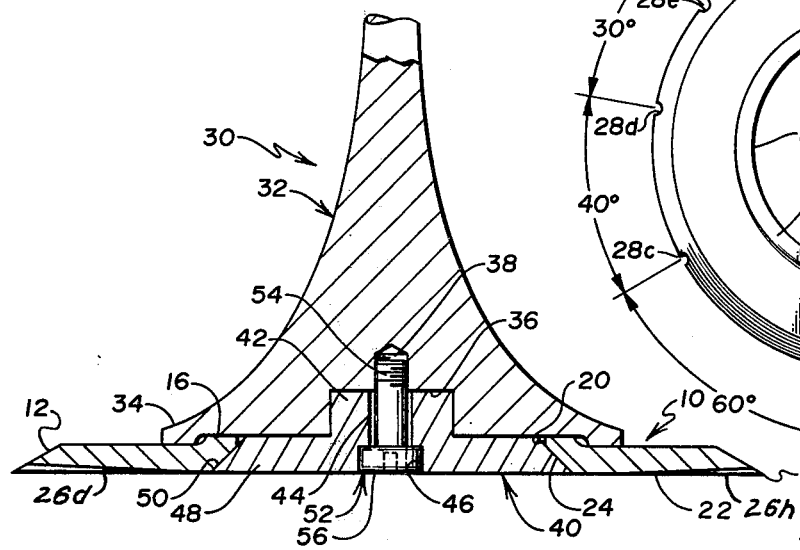
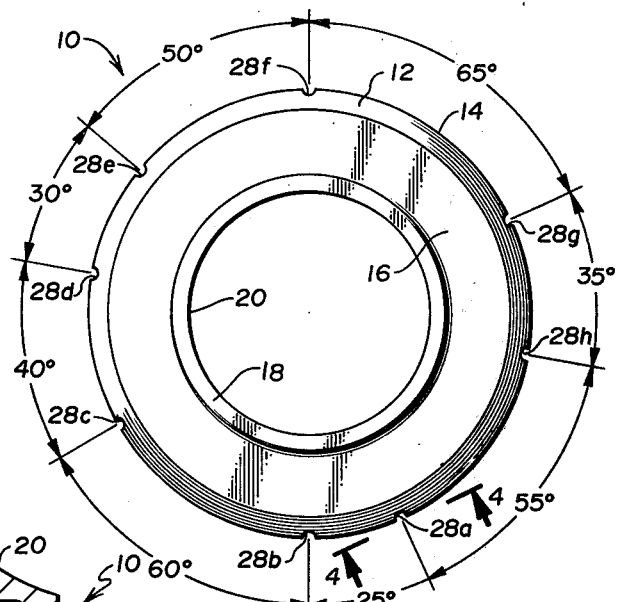
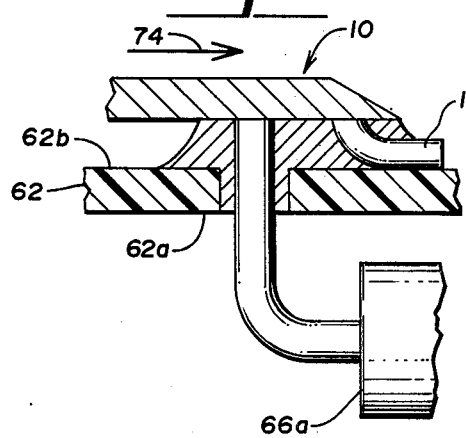
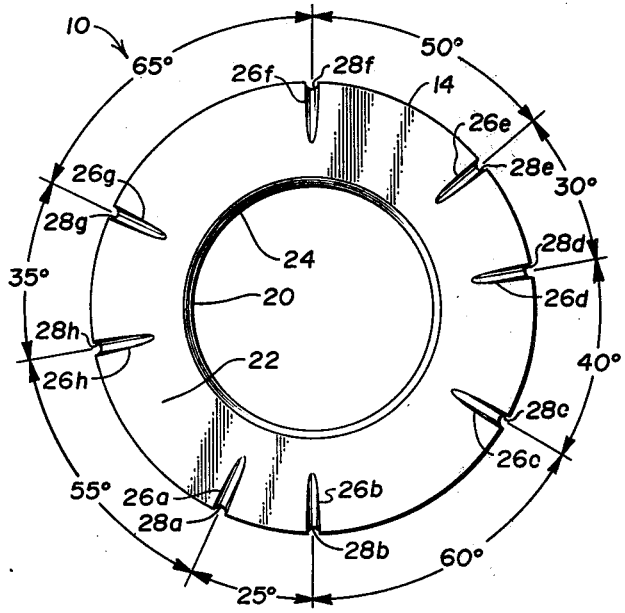
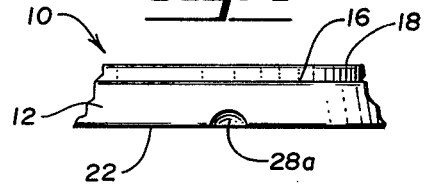

CUTTER RING FOR TRIMMING PRINTED CIRCUIT BOARDS

BACKGROUND OF THE INVENTION

1. Field of the Invention

This invention relates generally to rotary cutting tools, and pertains more particularly to a cutter ring for trimming the leads from printed circuit boards.

2. Description of the Prior Art

Generally, printed circuit boards have various electrical components located on one side of the substrate laminate with wiring on the other side. Stated somewhat differently, the leads of the various components are initially inserted through holes in the laminate from the unwired side and are then soldered in place, usually by dip soldering or flow soldering. The soldering not only anchors the leads in place but also effects the necessary electrical connections between the components and the printed wiring.

Since the leads on the various electrical components vary in length, it follows that the leads when inserted will project various distances from the back side of the substrate laminate, usually beyond the solder fillet resulting from the soldering operation. Hence, the need exists for trimming all of the leads so that their ends reside in a single or common plane. Frequently, the cutting or trimming is not only through the leads themselves but also through some of the solder fillets surrounding the leads, the frequency depending in large measure as to how short the ends are to be cropped. This results in a number of problems, the problems varying with how the leads are actually cut.

One common procedure for trimming printed circuit boards is to employ a cutting tool utilizing a cutter ring having a smooth beveled cutting edge. The cutting tool is either hand held or mounted in a fixture (usually the latter) so that the ring can be advanced, while rotating, through the projecting end portions of the leads and also through any solder encircling the leads at that level.

An example of the unserrated type of ring cutter is illustrated in U.S. Pat. No. 2,894,583, granted on July 14, 1959 to Dagfin Johnstad, and titled "Honeycomb Cutter." While the performance of a cutting of this character is generally acceptable, there still are a number of shortcomings for which satisfactory solutions have not been presented.

One difficulty stemming from the use of a smooth edge cutter ring is that while each resharpening or regrinding is less costly than some arrangements, a considerable amount of heat is generated during use because of the friction that is developed from the rubbing that takes place. The rubbing that occurs causes the ring to wear rapidly, thereby requiring a greater number of resharpenings. Also, the cutter ring as it is advanced, tends to load up with both solder and metal from the lead being cut. Of course, the thicker the leads and/or the thicker the solder fillets, the greater the loading rate.

Additionally, so-called foldovers and flags are produced which result in a defective circuit board if these partially severed lead sections are not removed, their removal being time-consuming and likely to damage the rather delicate printed wiring if insufficient care is not exercised.

Still further, a smooth or unserrated ring normally requires that some medium be employed for holding the leads in a rigid or semirigid fashion during the cutting action. Otherwise, they may flex to such a degree that the cutter ring cannot cut effectively. Solder, wax, paraffin, vacuum packaging and the like have been resorted to, all of which contribute to the overall fabrication expense.

In some respects, an improvement upon the smooth or unserrated variety of cutting ring referred to above is a cutter ring utilizing a serrated cutting edge. Although not described as being useful for trimming printed circuit boards, an example of a serrated ring is set forth in U.S. Pat. No. 2,531,841, issued on Nov. 28, 1950 to Frank J. Cashin. This style of cutter ring makes use of numerous serrations that are evenly spaced with respect to each other around its peripheral cutting edge.

However, with the cutter ring rotating at a constant speed, objectionable vibrations are set up in the trimming of printed circuit boards. Unfortunately, vibrations can be sufficiently severe so as to damage the circuit components in a number of instances. The vibrations also cause the substrate laminate to vibrate toward and away from the cutting edge of the cutter ring. This results in excessive rubbing against the tool's cutting edge, the resulting friction creating a concomitant amount of heat that has proved even more objectionable than when using smooth cutting edges. The serrations themselves are difficult to sharpen and cause the uncut or partially cut leads to be pushed over by reason of the blunting or dulling that results and which is accelerated by reason of the excessive friction. Consequently, this technique also causes objectionable foldovers and flags to be produced. The employment of uniformly spaced serrations produces an extreme shocking action on the material being cut and also on the serrated ring. This at times proves detrimental to the substance being cut and can cause fracturing and dulling of the ring.

Because of the above, manufacturers of equipment designated for trimming printed circuit boards endeavor to reduce the problems caused by vibration by going to very high rotational speeds. While this does tend to reduce the vibration on the material being cut, it nonetheless magnifies or aggravates an already unsafe situation as far as the worker is concerned, for it is he who is vulnerable to injury from the flying pieces of a broken cutter ring.

SUMMARY OF THE INVENTION

Accordingly, one general object of my invention is to produce cuts that are cleaner and more uniform than in the past. As far as printed circuitry is concerned, the invention eliminates the highly objectionable foldovers and flags.

Another object of the invention is to allow the operator to trim closer to, or farther from, the surface of the substrate laminate, as fabrication and design circumstances dictate.

Another object is to reduce the number of sharpenings for a given number of cuts. In this regard, it is within the purview of the invention to provide a cutter ring that will last five to ten times as long between resharpenings as can now be realized.

Still another object of the invention is to dampen the detrimental vibrations set up by uniformly serrated cutter rings to such an extent that they are no longer objectionable.

Yet another object is to provide a cutter ring that will cut through a variety of both soft and hard materials without causing the ring to run hot, load up, chatter or shatter.

Still further, an object is to permit printed circuit boards to be trimmed either prior to, or after, soldering, the invention giving superior results in either instance. More specifically, an aim of the invention is to obviate the need for employing a supporting medium for the leads projecting from a printed circuit board.

Another object is to allow a lead to be cut above its solder fillet, or cut through the fillet in any selected plane, even though the fillet varies in thickness. In other words, there is no common best height at which to trim leads, yet my invention enables the leads to be trimmed at the particular height that is best for that specific printed circuit. In this regard, the invention permits board trimming above screws and the like.

Still further, an object is to reduce the force required in pushing or forcing the cutter ring through the material being trimmed or cut.

A still further object is to permit rotary tools or holders already in existence to be employed, it being only necessary to substitute my cutter ring for the smooth or serrated ring, as the case may be, now in use. This enables the customary fixtures to be employed in that the cutting tool or holder itself is not changed, only the cutter ring being modified.

A further object is to provide an improved cutter ring that will be only slightly more expensive than a smooth cutter ring and which will be less expensive than an evenly notched or serrated cutter ring.

Briefly, my invention envisages a cutter ring formed with a cutting edge that has unevenly spaced notches formed therein, and more specifically a beveled cutting edge provided with such notches.

BRIEF DESCRIPTION OF THE DRAWINGS

FIG. 1 is a sectional view of a holder containing a cutter ring utilizing the teachings of my invention;

FIG. 2 is a top plan view of my cutter ring showing a number of peripherally disposed notches, the denoted angles therebetween providing an unevenly or nonuniformly spacing of the notches;

FIG. 3 is a bottom plan view, this view also depicting the irregular angular notch spacings;

FIG. 4 is an enlarged segmental view taken in the direction of line 4—4 of FIG. 2 in order to show to better advantage one of the notches made use of in practicing my invention;

FIGS. 11–14 represent cutter progressions corresponding generally to FIGS. 7–10, respectively, but with a conventional ring being employed so as to show a resulting foldover or flag in FIG. 14.

DESCRIPTION OF THE PREFERRED EMBODIMENT

Figure 5:
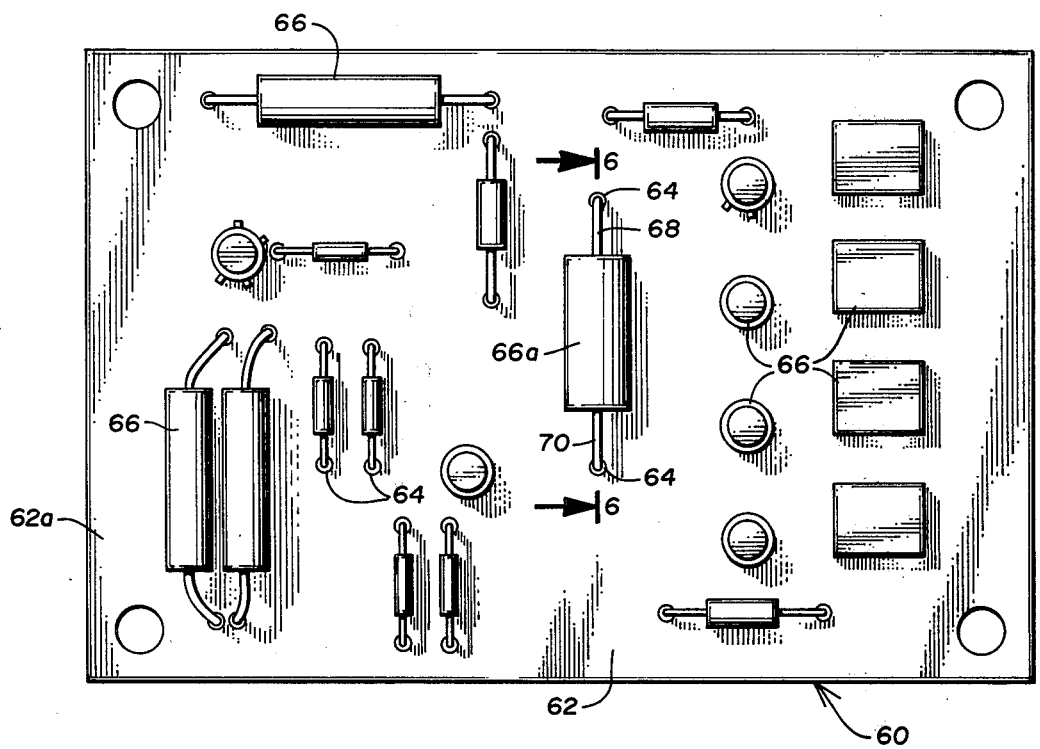
FIG. 5 is a top plan view of one side of a typical printed circuit board, this side containing various electrical components.

Referring now in detail to the drawings, it will be observed that my blade or cutter ring has been denoted generally by the reference numeral 10. More specifically, the cutter ring 10 has a beveled surface 12 forming a peripheral knife or cutting edge 14.

The upper surface 16 of the ring 10 is flat and has a circular rib 18 extending around a central opening 20 in the ring 10. In other words, the cutter ring 10 is of annular configuration.

The bottom surface, which has been labeled 22, is slightly inclined or concave, the bottom surface 22 sloping upwardly and inwardly at a few degrees from the cutting edge 14. The bottom surface 22 has a beveled surface 24 circumjacent the opening 20.

A number of radially directed grooves 26a, 26b, 26c, 26d, 26e, 26f, 26g, and 26h having a substantially semicircular cross section extend inwardly from the peripheral cutting edge 14, thereby forming semicircular notches 28a, 28b, 28c, 28d, 28e, 28f, 28g and 28h, the sides of which notches function as irregularly spaced cutting elements. The notches 28a–28h subtend small arcs of approximately 2° each. It is planned that the cutter ring 10 have a diameter of approximately three inches and that the various notches 28a–28h extend inwardly from the cutting edge 14 approximately 1/32 inch.

It is imperative that the various notches 28a–28h be nonuniformly or unevenly spaced. As can be discerned from FIGS. 2 and 3, the angles or segments between the various notches 28a–28h are all different from each other. In actual practice, it has been found that the angles should differ from each other by at least 3° and that adjacent angles should differ by at least 10 degrees. Specifically, the angular arcs found highly satisfactory are: 28a–28b=25°; 28b–28c=60°; 28c–28d=40°; 28d–28e=30°; 28e–28f=50°; 28f–28g=65°; 28g–28h=35°, and 28h–28a=55°.

The number of notches mentioned above and the various angles are for a cutter ring having the diameter hereinbefore mentioned, rotated at the speed alluded to below, and advanced at the usual feed rate that has been employed in the past for cutting operations of the envisaged character.

Consequently, when the cutter ring 10 is rotated at the usual number of revolutions per minute, more specifically, 3800 revolutions per minute, the sides of the various notches 28a–28h will strike the element being cut in a nonuniform or an unrhythmic pattern. This has the advantage of dampening the vibrations of larger amplitude that would be set up as a result of having the notches uniformly spaced and striking the material being cut at constant periods to produce a resonant action.

Although the rotary cutting tool or holder 30 can be of conventional construction, as far as holding and rotating the cutter ring 10, it will be helpful to describe the specific manner in which the cutter ring 10 is intended to be mounted. Therefore, an arbor 32 is illustrated having a flange 34 provided with an upwardly directed recess 36 centrally formed in its underside, a tapped hole 38 extending upwardly from the top of the recess 34.

Further included in the cutting tool or holder 30 is a retaining disc 40 having an upwardly directed hub 42, the hub having an untapped hole 44 therein. The underside of the retaining disc 40 is formed with an upwardly directed recess 46. Extending from the hub 42 is a flange 48 having a bevel 50 at its periphery.

A screw 52 has a threaded shank 54 and a socket head 56. The shank 54 engages the tapped hole 38, passing through the hole 44. In this way, the bevel 50 of the retaining disc 40 bears against the inwardly disposed bevel 24 formed on the cutter ring 10. The upper end of the arbor 32 is attached to a motor-driven chuck (not shown). Usually the chuck is part of a fixture for guiding the cutting tool 30 relative to the work, thereby advancing the rotating cutter ring 10 against the material that is to be cut or severed.

Inasmuch as my invention will be particularly useful in trimming printed circuit boards, a typical printed circuit board or assembly has been indicated generally by the reference numeral 60. Whereas the printed circuit board 60 may be a multilayered board, it is pictured as comprising but a single substrate laminate 62. As is conventional, the substrate laminate 62 is formed with a plurality of holes 64. Whereas these holes can be plated or eyelets used, for the sake of simplicity the holes 64 appearing in FIGS. 7–14 are shown as only bare holes. Usually, one side 62a of the printed circuit board 60 has all of the electric components thereon, the components having been collectively indicated by the reference numeral 66. One particular component 66a, which can be a capacitor, appears in FIGS. 7–14, having leads 68 and 70 extending from opposite ends thereof. The leads 68, 70 have been inserted through two of the holes 64.

Inasmuch as the leads 68 and 70 are to be electrically joined or connected to the printed wiring (not shown) which is on the back side 62b of the laminate 62, this being the side away from the components 66, it need only be mentioned that the soldering, whether it be performed by dip or flow soldering techniques (or some other method) results in various solder fillets 72 which encompass the leads 68 and 70.

Inasmuch as a multiplicity of electrical components 66 are normally associated with a printed circuit board, such as that labeled 60, it follows that numerous leads 68, 70 project from the back side of the board containing the printed wiring thereon. Such printed circuit boards are usually employed in confined spaces, it is virtually mandatory that the various projecting leads 68, 70 be trimmed or cut so that their extremities reside in a common plane quite close to the back side 62b of the laminate 62. However, the trimming operation presents a number of problems which have already been alluded to and which will perhaps be better understood by reason of FIGS. 7–14. FIGS. 7–10 show the use of my improved cutter ring 10, whereas FIGS. 11–14 depict the use of a conventional cutter ring labeled 10a.

Although the rotary cutting tool 30 making use of my cutter ring 10 can be held and advanced through the agency of a fixture especially designed for use in the trimming of printed circuit boards, it can be assumed that the cutting tool 30 is hand held in the illustrative situation and advanced with respect to the printed circuit board 60 while the board is stationary. Of course, the cutting tool 30 can be stationary and the printed circuit board 60 moved relative to the tool 30. Also, only a segment of the cutter ring 10 has been pictured, this being the segment performing the actual cutting.

The rotating cutter ring 10 is advanced in the direction of the lead 70 as indicated by the arrow 74.

Figure 6:
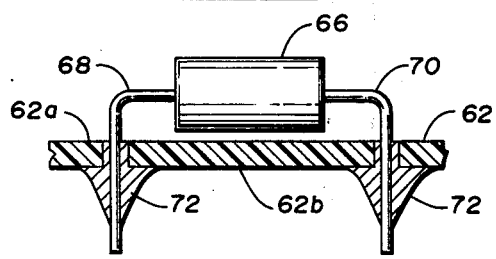
FIG. 6 is a sectional detail taken in the direction of line 6—6 of FIG. 5, the view showing two leads belonging to one of the components appearing in FIG. 5.
Figure 7:
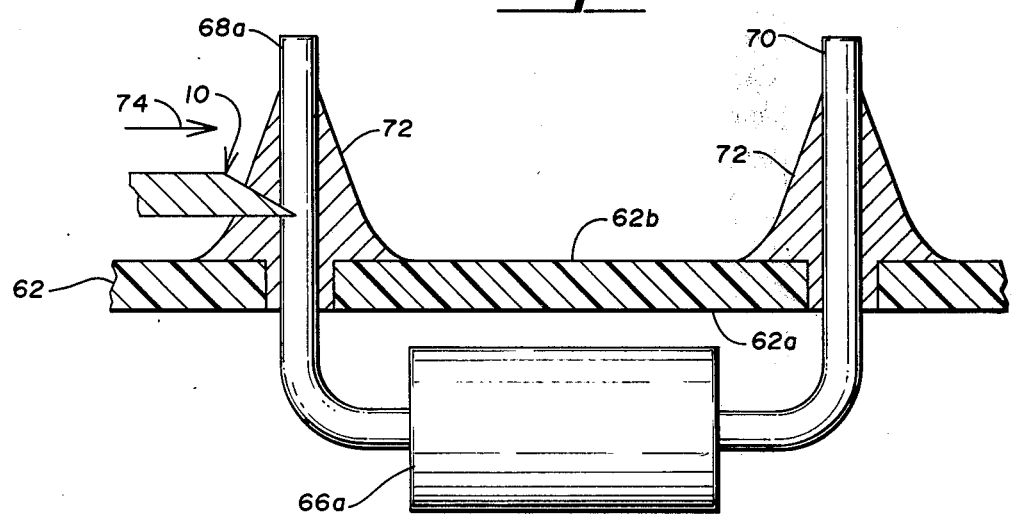
FIG. 7 is a greatly enlarged view corresponding to FIG. 6, the view being inverted for the purpose of depicting my cutter ring in the process of having cut approximately one-third of the way through the lead.

FIG. 7 is a substantially enlarged sectional detail as compared to FIG. 6, FIG. 7 also being inverted with respect to FIG. 6. Inasmuch as the rotating cutter ring 10 progressively severs not only the particular solder fillet 72 encircling the lead 68 but the lead itself, it will be of help, it is believed, to distinguish the progressively cut lead 68 with different letter suffixes. Accordingly, it will be seen from FIG. 7 that the lead 68 has been indicated by the numeral 68a, the lead 68a depicting the lead after it has been cut about one-third of the way through.

Figure 8:
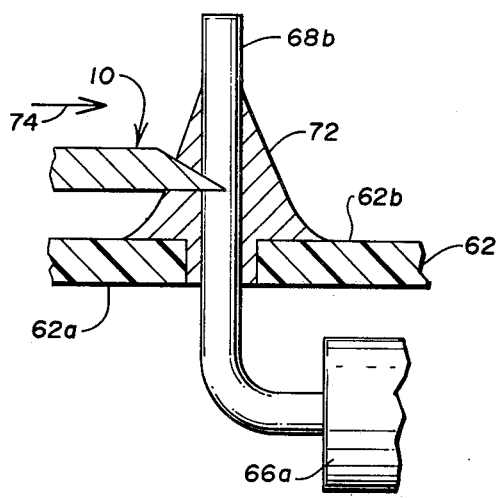
FIG. 8 is a view corresponding to the left portion of FIG. 7 but with my cutter ring slightly over half way through the lead.

FIG. 8 denotes the lead 68 after it has been cut a little more than 50%, the half-cut lead having been given the numeral 68b.

Figure 9:
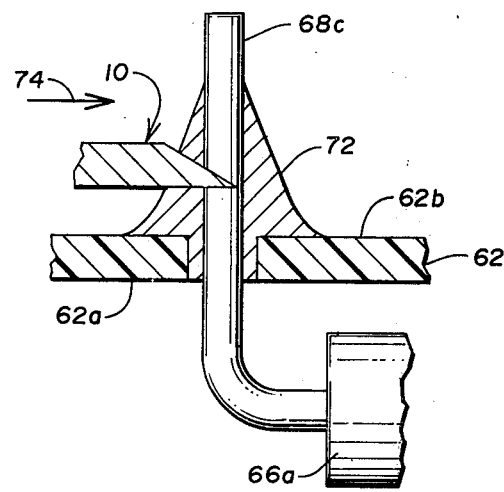
FIG. 9 is still another view but with the cutter ring approximately three-quarters of the way through the lead.

FIG. 9 represents a 75% cut and the lead in this instance has been denoted by the numeral 68c.

Figure 10:
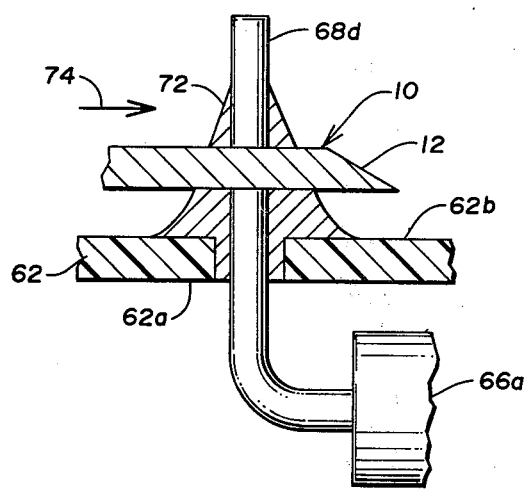
FIG. 10 is yet another view corresponding to FIG. 7 but with the cutter ring having completed its cut.

However, FIG. 10 reflects a complete or 100% cut and the detached section of the lead has been given the reference numeral 68d. It will be observed that this severed section 68d is still vertical and has not been bent over before being completely cut as is apt to happen when using a conventional cutter ring, such as that denoted by the reference numeral 10a in FIGS. 11–14.

Figure 11:
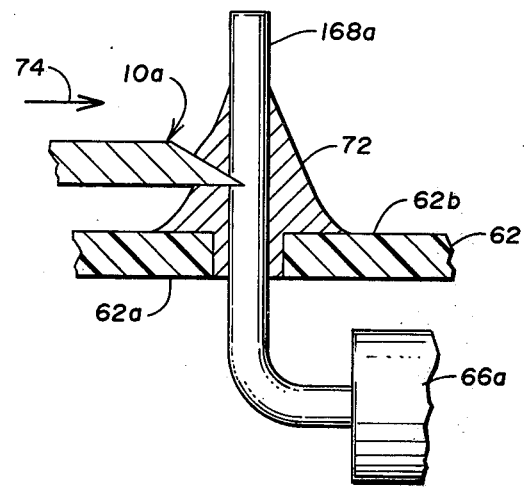

FIG. 11 corresponds to FIG. 7 as far as the degree of cutting is concerned. For all intents and purposes, the cutting action cannot be distinguished at this stage from that occurring when using my cutter ring 10 in FIG. 7. Nonetheless, the one-third partially cut lead has been given the reference numeral 168a.

Figure 12:
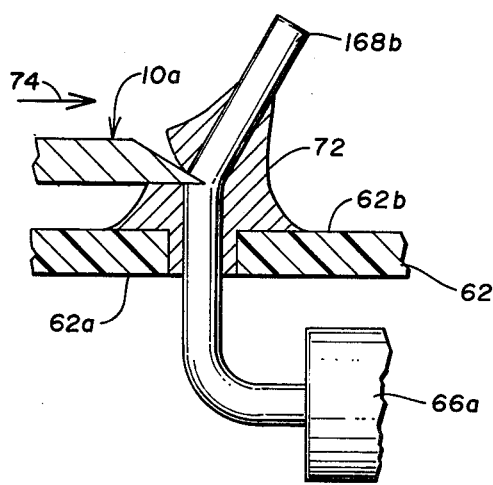

By the time that the lead has been 50% cut, as shown in FIG. 12, then the lead 168b tends to bend over. The remaining or uncut portion of the lead 168b constitutes a stress area and resists the cutting of the cutter ring 10a. Owing to the increased amount of rubbing and friction of the portion of the lead 168b that has already been cut against the bevelled surface of the cutter ring, more heat is produced so the cutter ring 10a requires a more frequent resharpening than does the cutter ring 10.

Figure 13:
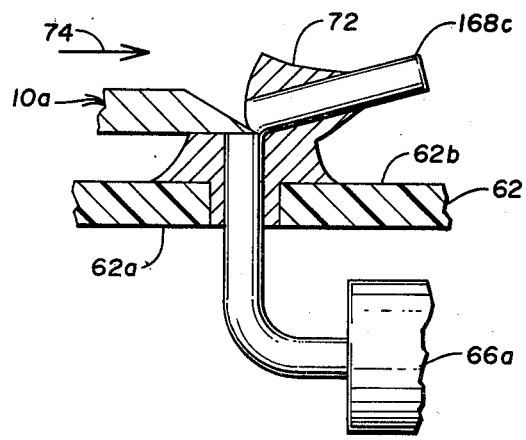

By the time that 75% of the thickness of the lead has been cut or severed, as can be discerned from FIG. 13, the lead, which has been labeled 168c, is bent considerably, actually through an angle of approximately 90°.

FIG. 15 portrays the condition indicating that the cutting action is not clean. The result is that a fold-over or flag type of situation has resulted, the lead in this instance having been designated by the reference numeral 168d. Because the cut is not clean or complete, it follows that the flag 170d in many instances will touch or engage portions of the printed wiring that should not be electrically connected to the lead 70. Thus, the capacitor 66a (or any one of the other components 66 under similar circumstances) can be shorted out with the consequence that the entire printed circuit board 60 becomes defective. Precautionary measures must be taken to remove the various flags that exist. However, the wire brushing or burnishing needed to remove the flags adds to the fabrication cost. Furthermore, if care is not exercised, the printed wiring itself can be scratched and damaged.

Whereas a smooth or unserrated cutting edge creates certain difficulties, as already mentioned, the evenly spaced serrated tooth type of edge causes severe vibrations, each tooth reinforcing the preceding one. In this regard, the side of each successive notch engages the lead being cut, giving the lead an added impetus each time it is struck.

On the other hand, when utilizing the teachings of my invention, the irregular spacing of the notches will dampen the tendency to vibrate. In this regard, whereas the side of one notch might very well give an impetus or kick to the lead being cut, the corresponding side of the next notch will arrive in an out-of-phase relation, as will succeeding notches. Therefore, the side of the irregularly spaced notches will strike the lead so as to dampen or retard the vibration. Consequently, although the cutter ring 10 does not represent a drastically different physical change from other cutter rings, the advantages or benefits are phenomenal.

I claim:

1. A cutter ring provided with a peripheral beveled knife edge formed with a number of irregularly spaced notches, said notches curving inwardly from said peripheral knife edge and said notches having unequal angles therebetween.

2. The cutter ring of claim 1 in which said unequal angles differ from each other by at least 3°.

3. The cutter ring of claim 1 in which adjacent angles differ from each other by at least 10°.

4. The cutter ring of claim 3 in which said notches subtend an arc of approximately 2°.

5. The cutter ring of claim 1 in which said notches subtend an angle less than the smallest difference between unequal angles.

6. The cutter ring of claim 5 in which said notches subtend an angle of approximately 2° and said smallest distance between unequal angles is approximately at least 3°.

7. The cutter ring of claim 6 in which said number of notches is at least eight.

8. The cutter ring of claim 7 in which adjacent angles differ by at least 10°.

* * * * *